United States Patent
Sinsheimer et al.

(10) Patent No.: US 10,451,652 B2
(45) Date of Patent: Oct. 22, 2019

(54) COAXIAL STRUCTURE FOR TRANSMISSION OF SIGNALS IN TEST EQUIPMENT

(71) Applicant: Teradyne, Inc., North Reading, MA (US)

(72) Inventors: Roger Allen Sinsheimer, Camarillo, CA (US); David Walter Lewinnek, Somerville, MA (US); Luis Antonio Valiente, Dracut, MA (US)

(73) Assignee: Teradyne, Inc., North Reading, MA (US)

( * ) Notice: Subject to any disclaimer, the term of this patent is extended or adjusted under 35 U.S.C. 154(b) by 856 days.

(21) Appl. No.: 14/332,757

(22) Filed: Jul. 16, 2014

(65) Prior Publication Data

US 2016/0018442 A1    Jan. 21, 2016

(51) Int. Cl.
*G01R 1/18* (2006.01)
*G01R 1/04* (2006.01)
*G01R 1/073* (2006.01)
*G01R 1/20* (2006.01)

(52) U.S. Cl.
CPC ....... *G01R 1/0491* (2013.01); *G01R 1/07357* (2013.01); *G01R 1/07378* (2013.01); *G01R 1/18* (2013.01); *G01R 1/20* (2013.01)

(58) Field of Classification Search
CPC .... G01R 1/07314; G01R 1/20; G01R 1/0491; G01R 1/18; G01R 1/07357; G01R 1/07378
See application file for complete search history.

(56) References Cited

U.S. PATENT DOCUMENTS

| | | |
|---|---|---|
| 5,471,148 A | 11/1995 | Sinsheimer et al. |
| 5,528,158 A | 6/1996 | Sinsheimer et al. |
| 5,629,630 A | 5/1997 | Thompson et al. |
| 6,027,346 A | 2/2000 | Sinsheimer et al. |
| 6,107,813 A | 8/2000 | Sinsheimer et al. |
| 6,166,553 A | 12/2000 | Sinsheimer |
| 6,833,696 B2 | 12/2004 | Sinsheimer et al. |
| 6,888,427 B2 | 5/2005 | Sinsheimer et al. |
| 6,963,211 B2 | 11/2005 | Sinsheimer et al. |
| 7,078,890 B2 | 7/2006 | Sinsheimer et al. |

(Continued)

FOREIGN PATENT DOCUMENTS

| | | |
|---|---|---|
| CN | 1659810 A | 8/2005 |
| WO | WO-2016/010888 A1 | 1/2016 |

OTHER PUBLICATIONS

International Preliminary Report on Patentability for PCT/US2015/040128, 7 pages (dated Jan. 17, 2017).

(Continued)

*Primary Examiner* — Neel D Shah
*Assistant Examiner* — Brent J Andrews
(74) *Attorney, Agent, or Firm* — Burns & Levinson

(57) ABSTRACT

An example system includes a circuit board having electrical elements; a wafer having contacts; and an interconnect to route signals between the electrical elements and the contacts. The interconnect includes multiple layers, each of which includes a flexible circuit. The flexible circuit includes a conductive trace disposed thereon. The interconnect also includes shielding between adjacent layers of the multiple layers. The shielding is electrically connected to ground.

45 Claims, 11 Drawing Sheets

(56) References Cited

U.S. PATENT DOCUMENTS

| | | |
|---|---|---|
| 7,295,024 B2 | 11/2007 | Sinsheimer |
| 7,358,754 B2 | 4/2008 | Sinsheimer et al. |
| 9,435,855 B2 | 9/2016 | Lewinnek et al. |
| 9,594,114 B2 | 3/2017 | Sinsheimer |
| 9,786,977 B2 | 10/2017 | Lyons et al. |
| 10,060,475 B2 | 8/2018 | Sinsheimer et al. |
| 2003/0074611 A1 | 4/2003 | Nachumovsky |
| 2003/0222282 A1 | 12/2003 | Fjelstad et al. |
| 2004/0046579 A1* | 3/2004 | Chraft ............... G01R 1/07314 324/750.27 |
| 2004/0061513 A1* | 4/2004 | Sweet ............... G01R 1/06722 324/755.05 |
| 2004/0135656 A1* | 7/2004 | Sinsheimer ............. H01P 3/081 333/238 |
| 2004/0174174 A1 | 9/2004 | Sinsheimer et al. |
| 2005/0046411 A1 | 3/2005 | Sinsheimer et al. |
| 2005/0208828 A1* | 9/2005 | Miller ................. H01R 9/0515 439/581 |
| 2005/0264311 A1 | 12/2005 | Sinsheimer et al. |
| 2006/0183377 A1 | 8/2006 | Sinsheimer |
| 2006/0244471 A1 | 11/2006 | Sinsheimer et al. |
| 2007/0126439 A1 | 6/2007 | Sinsheimer et al. |
| 2007/0176615 A1 | 8/2007 | Sinsheimer |
| 2007/0268031 A1 | 11/2007 | Di Stefano |
| 2008/0025012 A1 | 1/2008 | Sinsheimer |
| 2008/0030211 A1 | 2/2008 | Sinsheimer |
| 2008/0030212 A1 | 2/2008 | Sinsheimer |
| 2008/0030213 A1 | 2/2008 | Sinsheimer |
| 2010/0244867 A1 | 9/2010 | Chong et al. |
| 2012/0152309 A1 | 6/2012 | Miller et al. |
| 2012/0299798 A1* | 11/2012 | Leisten ................... H01Q 5/35 343/895 |
| 2015/0137848 A1 | 5/2015 | Lewinnek et al. |
| 2015/0377946 A1 | 12/2015 | Sinsheimer |
| 2016/0131702 A1 | 5/2016 | Sinsheimer |
| 2016/0186804 A1 | 6/2016 | Sinsheimer et al. |
| 2017/0170537 A1 | 6/2017 | Lyons et al. |

OTHER PUBLICATIONS

International Search Report for PCT/US2015/040128, 3 pages (dated Oct. 29, 2015).

Written Opinion for PCT/US2015/040128, 3 pages (dated Oct. 29, 2015).

Chinese Office ACtion for 201580036175.0, 8 pages (dated Nov. 28, 2018). Chinese version, no English Translation available: see accompanying Information Disclosure Statement transmittal for statement of relevance of this non-English language document.

\* cited by examiner

COAXIAL STRUCTURE FOR TRANSMISSION OF SIGNALS IN TEST EQUIPMENT

TECHNICAL FIELD

This specification relates generally to a coaxial structure for the transmission of signals in test equipment or other electronics.

BACKGROUND

Wafer-level testing includes testing dice on a wafer. In this specification, "dice" is used as the plural of "die". Since dice are fragile, it is preferable not to touch any die more than once during test. However, since dice are typically patterned on a circular wafer, testing any set of dice may involve touching several dice more than once. Furthermore, a device that touches the dice may have to partially step (walk) off of the wafer for all dice to be touched.

There is a certain amount of test circuitry that needs to have a good electrical path (e.g., low loss, low inductance, and low crosstalk) to test a die. This circuitry often takes-up several square inches of a test board per die being tested.

SUMMARY

An example system comprises: a circuit board comprising electrical elements; a wafer comprising contacts; and an interconnect to route signals between the electrical elements and the contacts. The interconnect comprises multiple layers, where each of the multiple layers comprises a flexible circuit, and where the flexible circuit comprises a conductive trace disposed thereon. The interconnect also comprises shielding between adjacent layers of the multiple layers. The shielding is electrically connected to ground. The example system may include one or more of the following features, either alone or in combination.

The flexible circuit may comprise a dielectric, and an end of the conductive trace may extend beyond the dielectric. The interconnect may comprise a second dielectric. The end of the conductive trace may bend around the second dielectric. The end of the conductive trace may comprise an electrical contact.

The shielding for each conductive trace may comprise a conductive layer above the conductive trace and a conductive layer below the conductive trace. Each of the conductive layer above the conductive trace and the conductive layer below the conductive trace may have a cut-away portion. Each of the conductive layer above the conductive trace and the conductive layer below the conductive trace may be arranged so that at least part of the conductive trace is between cut-away portions of different conductive layers.

The shielding may comprise multiple layers of shielding arranged within the interconnect so that each conductive trace is between two layers of shielding. Each of the two-layers of shielding may have a cut-away portion adjacent to a corresponding conductive trace. A cut-away portion of each of the two layers may be arranged relative to the conductive trace so that there is air between the conductive trace and each of the two layers of shielding.

At least some conductive traces in the interconnect may comprise curved or serpentine portions configured to achieve substantially matching electrical path lengths and time-of-flight, impedances, and signal attenuation between different conductive traces in the interconnect.

The electrical elements may be arranged at a first pitch and the contacts may be arranged at a second pitch. The interconnect may be configured to translate between the first pitch and the second pitch.

An interposer may be between the interconnect and the circuit board. The interposer may comprise a part of an electrical pathway between the electrical elements and the contacts. The system may comprise contacts on the interposer that are electrically-conductive and mechanically-compliant. The contacts may provide a mechanically-compliant electrical connection between the interposer and the corresponding contacts on the wafer.

The circuit board may comprise electronics associated with each of the electrical elements, where electronics associated with a corresponding electrical element are for supporting operation of the corresponding electrical element.

The system may comprise pins between the interconnect and the wafer, where the pins are for providing at least part of an electrical pathway between the contacts and the interconnect. An interface board may be between the pins and the interconnect. The interface board may be at least part of the electrical pathway between the contacts and the interconnect. The interface board may comprise electronic components in the electrical pathway.

The electronic components may comprise passive electronic components. The electronic components may comprise at least one of capacitors, baluns or switches. The electronic components may comprise active electronic components. Each of the electrical elements may comprise part of a radio frequency (RF) probe card. The electrical elements may comprise electrical cables that terminate on the circuit board. The contacts may be arranged in parallel rows on the wafer, and the system may comprise a tester to make electrical contact between the interconnect and a subset of the contacts.

Another example system comprises: a circuit board comprising electrical elements; a wafer comprising contacts; and an interconnect to route signals between the electrical elements and the contacts. The interconnect comprises multiple layers, each of which comprises a conductor surrounded by a dielectric. The interconnect further comprises shielding between adjacent layers of the multiple layers, where the shielding is electrically connected to ground. The example system may include one or more of the following features, either alone or in combination.

An end of the conductor may extend beyond the dielectric. The interconnect may comprise a second dielectric. The end of the conductor may bend around the second dielectric. The end of the conductor may comprise an electrical contact. An end of the conductor may extend beyond the dielectric and contact a conductive nail head comprising an electrical contact.

The shielding for each conductor may comprise a conductive layer above the conductor and a conductive layer below the conductor. Each of the conductive layer above the conductor and the conductive layer below the conductor may have a cut-away portion. Each of the conductive layer above the conductor and the conductive layer below the conductor may be arranged so that at least part of the conductor is between cut-away portions of different conductive layers.

The shielding may comprise multiple layers of shielding arranged within the interconnect so that each conductor is between two layers of shielding. Each of the two-layers of shielding may have a cut-away portion adjacent to a conductor. A cut-away portion of each of the two layers may be arranged relative to the conductor so that there is air between the conductor and each of the two layers of shielding.

At least some conductors in the interconnect may comprise curved or serpentine portions configured to achieve substantially matching electrical path lengths and time-of-flight, impedances, and signal attenuation between different conductors in the interconnect.

The electrical elements may be arranged at a first pitch and the contacts may be arranged at a second pitch. The interconnect may be configured to translate between the first pitch and the second pitch. An interposer may be between the interconnect and the circuit board. The interposer may comprise a part of the electrical pathway between the electrical elements and the contacts.

The system may comprise contacts on the interposer that are electrically-conductive and mechanically-compliant, where the contacts are to provide a mechanically-compliant electrical connection between the interposer and the corresponding contacts on the wafer. The circuit board may comprise electronics associated with each of the electrical elements. The electronics may be for supporting operation of a corresponding electrical element.

The system may comprise pins between the interconnect and the wafer, where the pins are for providing at least part of an electrical pathway between the contacts and the interconnect. An interface board may be between the pins and the interconnect. The interface board may be at least part of the electrical pathway between the contacts and the interconnect. The interface board may comprise electronic components in the electrical pathway.

The electronic components may comprise passive electronic components. The electronic components may comprise at least one of capacitors, baluns or switches. The electronic components may comprise active electronic components. Each of the electrical elements may comprise part of a radio frequency (RF) probe card. The electrical elements may comprise electrical cables that terminate on the circuit board. The contacts may be arranged in parallel rows on the wafer. The system may comprise a tester to make electrical contact between the interconnect and a subset of the contacts.

An example structure for transmitting electrical signals comprises multiple layers, where each of the multiple layers comprises: flexible circuits, where the flexible circuits comprise conductive traces disposed thereon for transmitting the electrical signals; and shielding between adjacent layers of the multiple layers, where the shielding is electrically connected to ground and comprises a return path for the conductive traces, and where the shielding is separated from the conductive traces. The example structure may include one or more of the following features, either alone or in combination.

Each flexible circuit may comprise a dielectric, and an end of the conductive trace may extend beyond the dielectric. The structure may comprise a second dielectric. The end of the conductive trace may bend around the second dielectric. The end of the conductive trace may comprise an electrical contact.

The shielding for each conductive trace may comprise a conductive layer above the conductive trace and a conductive layer below the conductive trace, where each of the conductive layer above the conductive trace and the conductive layer below the conductive trace has a cut-away portion, and where each of the conductive layer above the conductive trace and the conductive layer below the conductive trace is arranged so that at least part of the conductive trace is between cut-away portions of different conductive layers.

The shielding may comprise multiple layers of shielding arranged within the structure so that each conductive trace is between two layers of shielding, where each of the two-layers of shielding has a cut-away portion adjacent to a corresponding conductive trace. A cut-away portion of each of the two layers may be arranged relative to the conductive trace so that there is air between the conductive trace and each of the two layers of shielding.

At least some conductive traces in the structure may comprise curved or serpentine portions configured to achieve substantially matching electrical path lengths and time-of-flight, impedances, and signal attenuation between different conductive traces.

Another example structure for transmitting electrical signals comprises multiple layers, where each of the multiple layers comprises: conductors surrounded by dielectric, where the conductors are for transmitting the electrical signals; and shielding between adjacent layers of the multiple layers, where the shielding is electrically connected to ground and comprises a return path for the conductors. The example structure may include one or more of the following features, either alone or in combination.

An end of a conductor may extend beyond corresponding dielectric. The structure may comprise a second dielectric. The end of the conductor may bend around the second dielectric. The end of the conductor may comprise an electrical contact. An end of a conductor may extend beyond the dielectric and contact a conductive nail head comprising an electrical contact.

The shielding for each conductor may comprise a conductive layer above the conductor and a conductive layer below the conductor. Each of the conductive layer above the conductor and the conductive layer below the conductor may have a cut-away portion. Each of the conductive layer above the conductor and the conductive layer below the conductor may be arranged so that at least part of the conductor is between cut-away portions of different conductive layers.

The shielding may comprise multiple layers of shielding arranged within the structure so that each conductor is between two layers of shielding, where each of the two-layers of shielding has a cut-away portion adjacent to a conductor. A cut-away portion of each of the two layers may be arranged relative to the conductor so that there is air between the conductor and each of the two layers of shielding.

At least some conductors in the structure may comprise curved or serpentine portions configured to achieve substantially matching electrical path lengths and time-of-flight, impedances, and signal attenuation between different conductors in the structure.

Any two or more of the features described in this specification, including in this summary section, can be combined to form implementations not specifically described herein.

The test systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The test systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

Figure 1:
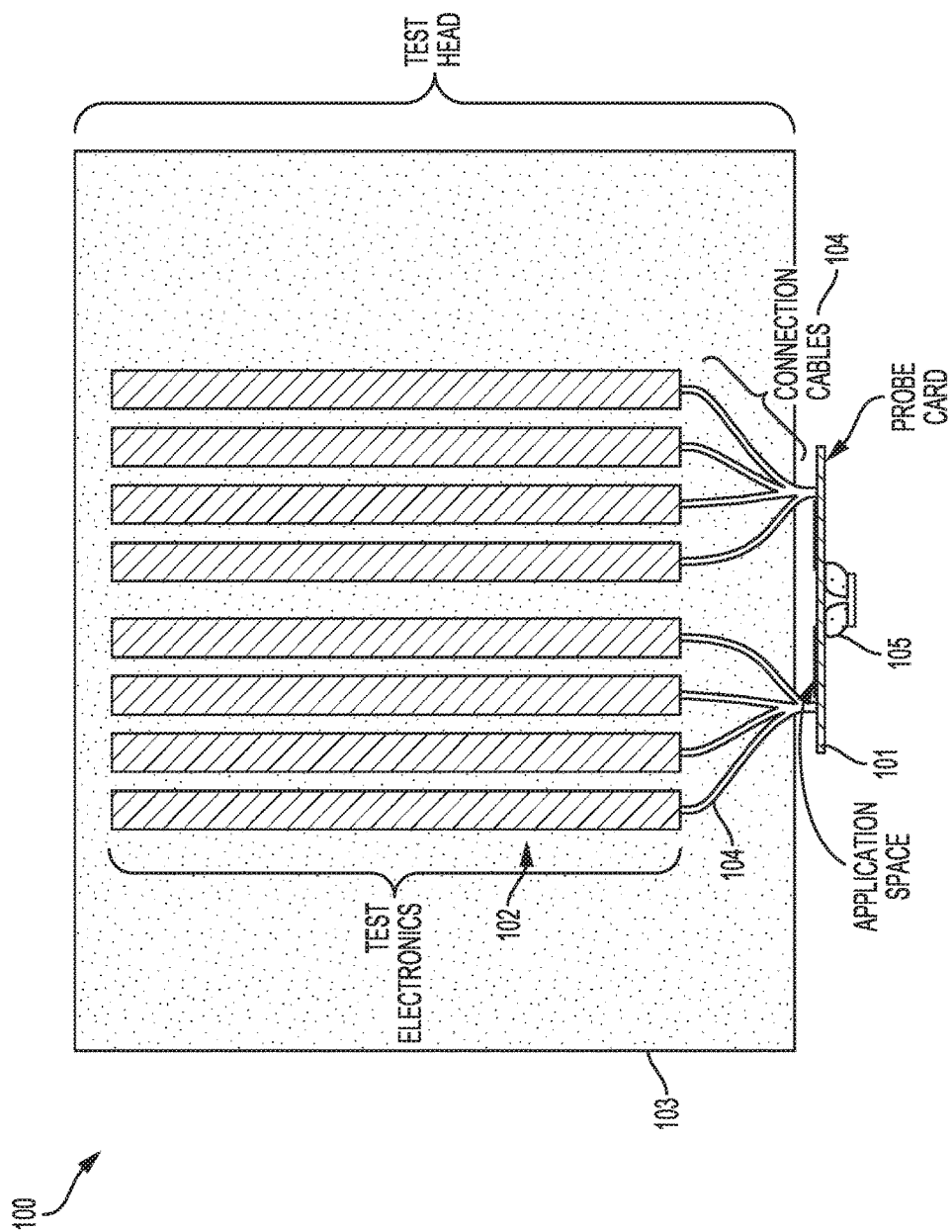
FIG. 1 is a side view of an example implementation of a test system.

Manufacturers may test devices at various stages of manufacturing. In an example manufacturing process, integrated circuits are fabricated in large quantities on a single silicon wafer. The wafer is cut into individual integrated circuits called dice. Each die is loaded into a frame, and bonding wires are attached to connect the die to leads that extend from the frame. The loaded frame is then encapsulated in plastic or another packaging material to produce a finished product.

Manufacturers have an economic incentive to detect and discard faulty components as early as possible in the manufacturing process. Accordingly, many manufacturers test integrated circuits at the wafer level, before a wafer is cut. Defective circuits are identified and generally discarded prior to packaging, thus saving the cost of packaging defective dice. As a final check, many manufacturers test each finished product before it is shipped. Such a process tests parts in packages that have had additional expense added to them over bare dice. So, having accurate test results reduces the need to discard valuable parts.

To test quantities of devices, manufacturers commonly use ATE, e.g. Automatic Test Equipment (or "testers"). In response to instructions in a test program set (TPS), ATE automatically generates input signals to be applied to a device under test (DUT), such as a bare die or dice, and monitors resulting output signals. The ATE compares the output signals with expected responses to determine whether each DUT is defective. ATE typically includes a computer system and a test instruments or devices having corresponding functionalities.

In some implementations, ATE is used to test electronic devices, or dice, at the wafer level. The electronic devices being tested on the wafer are the DUTs, and are different from electronic devices on a printed circuit board (PCB) that are components that enable testing. In some implementations the PCB is used for radio frequency (RF) testing, and in other implementations the PCB may be used for other types of (e.g., non-RF) testing. In example implementations involving RF testing, components on the PCB for RF test are there, among other things, to provide a switching matrix between the many RF channels coming from the DUT and the lesser number of test channels available in the tester.

In example implementations that involve RF testing, also found on the PCB in the application apace are baluns, which may be used for impedance matching between the lines of the test system and the impedance lines of the DUT, and capacitors which support multiple power supplies of the DUTs by providing shorter, lower-inductance connections between stored energy in the capacitors and the DUT. This latter may be relevant in some instances because the DUT can switch power states so quickly that the power supply cannot track the desired voltage at the DUT due to the inductance of the lines connecting the power supply to the DUT. This phenomenon is a function of cable length and construction, and may be compensated for by supplemental bypass capacitors mounted as electrically close as possible to the DUT. These bypass capacitors provide a nearby (connected by a relatively low-inductance path) reserve supply of stored energy which can be called upon by the DUT when it turns on and limits over-voltage spiking when the DUT turns off. In some implementations, without the bypass capacitors both undervoltage (sag) and overvoltage (spike) conditions can occur at the DUT, creating either soft or, potentially, hard failures.

The PCB may be used in testing DUTs (e.g., dice) on the wafer en masse, e.g., in parallel (or simultaneously). In an example implementation, the PCB may be part of (or form) a test probe card (e.g., an RF test or other test probe card), which itself may be part of a device interface board (DIB) of an ATE. The probe card may be used in performing tests on the DUTs on the wafer. For example, the probe card may be brought into contact with multiple DUTs on the wafer, and tests may be performed in parallel on those DUTs. In an example, the probe card may be brought into contact with a 2×8 block of adjacent DUTs on the wafer or with any other appropriate block of DUTs. Thereafter, the probe card may be moved to a different (e.g., adjacent) block of DUTs on the wafer, and those DUTS may be tested. This process may be repeated until all DUTs on the wafer are tested. Contact between the probe card and DUTs on the wafer is described below.

FIG. 1 shows an example test system 100 that includes a PCB 101, which constitutes a probe card, and which includes components such as those described herein. As shown, signals are routed between PCB 101 and test electronics 102, which may be part of a tester test head 103. The test electronics may perform the actual testing on a DUT, e.g., by sending signals to the DUT, through cables 104, PCB 101, and interconnect 105 (examples of which are described below). Responses to those signals may retrace that path to reach the test electronics, where those responses are measured to determine whether a DUT is operating properly. In some implementations, the test electronics may have a different configuration than that shown, and may perform processing outside of the test head, e.g., at one or more processing devices, such as a computer.

In some implementations, cables 104 may be part of a coaxial structure. In this regard, cables 104 may be coaxial cables that are incorporated in the coaxial structure. For example, cables 104 may be an integral part of the coaxial structure, and may be formed inside the coaxial structure. In some implementations, a coaxial line in a coaxial structure includes, but is not limited to, a signal (or force) line surrounded completely by a dielectric, such as air, that is, in turn, surrounded completely by return (or ground) line. In some implementations of a coaxial line, the signal (or force) line may be partially surrounded by a dielectric, such as air, that is, in turn, surrounded only partially by return (or ground) line. In other words, "coaxial", as used herein, does not require that the same dielectric completely surround the force line, nor does it require that a return line completely surround the dielectric. This is the case for any coaxial line, cable, structure, etc. described herein.

In some implementations, the application space is the area of the test system that includes the switching matrix noted above, among other things. In this regard, the switching matrix is only an example of the type of circuitry that may be included in the application space. Accordingly, while the systems, apparatus and methods described herein are described in the context of the switching matrix, they are not limited to use with that type of circuitry, but rather may be used with any appropriate type of circuitry. Furthermore, the systems, apparatus and methods described herein are not limited to use with circuitry found in the application space of a test system, but rather may be used to implement any appropriate type of circuitry in any appropriate type of electronic or other type of system.

The switching matrix in the application space (AS) may include, but is not limited to, active and/or passive elements. For example, the switching matrix may include microwave switches, e.g., for routing signals and thereby selecting which devices are to be tested. Examples of other elements that may be part of the switching matrix, or otherwise included in the application space, include, but are not limited to, capacitors, baluns, and microwave integrated circuits (MIMICs), which may be gallium arsenide devices that are capable of generating and receiving high-speed signals. Other types of elements that are not described here may be part of the switching matrix.

In some implementations, the AS coaxial structure may be separate from the underlying PCB and directly connect to coaxial structures leading to the test head 103 and to the interconnect 105, thereby providing an end-to-end coaxial structure for the test system. In some implementations, this end-to-end coaxial structure includes coaxial signal transmission conduits from test electronics 102, through PCB 105, to a point at which the probe head contacts the DUTs. In some implementations, there may be no gaps in the coaxial transmission conduits. In other implementations, there may be one or more gaps in the coaxial transmission conduits (e.g., between different coaxial structures), with the gaps being breached by other types of transmission elements, such as stripline connections or other circuit elements. In some implementations, the AS coaxial structure may be used separately from, and in different circuitry than, the other coaxial structures described with respect to FIG. 1 including, but not limited to, interconnect 105.

In some implementations, in order to promote consistency in signal transmission, electrical characteristics of different conduits may substantially match. For example, the impedances of different conduits may be controlled to be substantially the same. In this context, impedance-control includes the ability to specify the impedance of individual conduits and to match the impedances of different conduits. Also, the electrical path length (as opposed to the physical path length) as measured by ToF (Time of Flight) of the different conduits may be substantially the same. And, the signal attenuation produced by different electrical conduits may be substantially the same. In some implementations, all electrical conduits in the AF coaxial structure have the same impedance, electrical path length, and attenuation. In other implementations, this is not the case, and those characteristics vary. For example, in some implementations, the test electronics may account for, and/or correct for, variations in one or more of these parameters.

As described herein, the switching matrix may be used to provide system end-to-end coaxial transmission between test electronics and DUTs on a wafer or elsewhere. In this regard, electronic devices on the PCB may be arranged at a specific pitch. In some implementations, a pitch includes the distance between parts (e.g., centers) of adjacent electronic devices. In other implementations, pitch may be defined differently. The pitch on the PCB is typically, although not necessarily, greater than the pitch of corresponding DUT contacts on the wafer. For instance, in some example implementations, the pitch on the PCB is 15 mm and the pitch on the wafer is 5 mm. Notably, the systems described herein may be used with any pitch values, and there may be cases where the pitches on the PCB and the wafer are the same.

Figure 2:
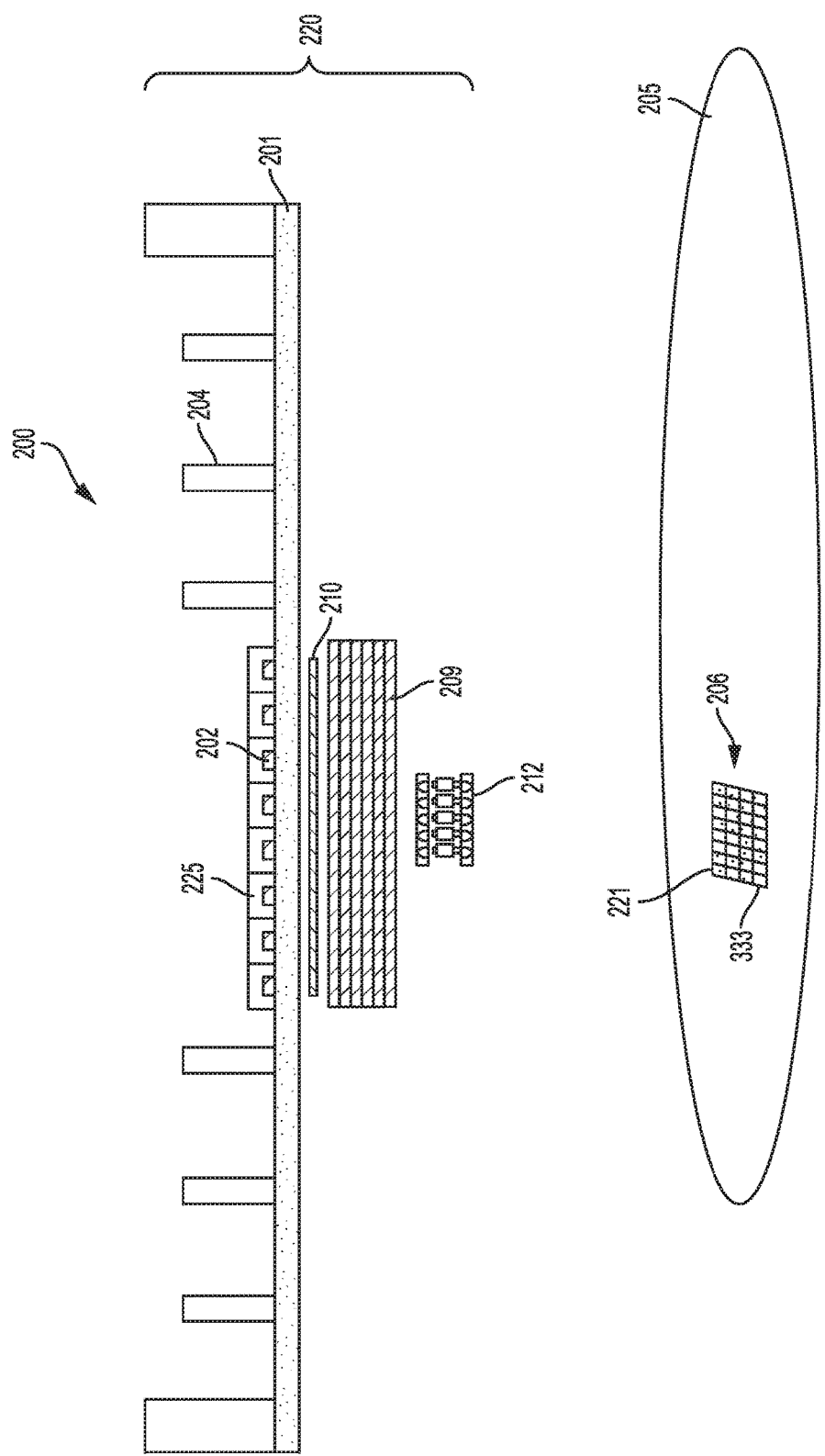
FIG. 2 is side view of an example implementation of components of a test system, such as the test system of FIG. 1.

FIG. 2 shows an example of a test system 200 of the type described with respect to FIG. 1. FIG. 2 also shows a comparison between the pitch of electronic devices 202 on a PCB to corresponding contacts 206 for DUTs on a wafer 205. As shown in FIG. 2, the DUT pattern for electronic devices 202 on the probe card has a difference in pitch than the actual DUTs 221, 222 on wafer 205.

In some implementations, the test systems described herein provide an interconnect 105, 209 to route signals between the AS coaxial structure, such as that described above, and DUT contacts on the wafer. This may be done using an interconnect that translates the pitch of the PCB to the pitch of the wafer. To this end, in an example implementation the electronic devices and associated circuitry are arranged on a PCB at a first pitch, e.g., with possibly inches between devices. The interconnect is used to translate from the first pitch space on the PCB to a pitch on a wafer (a second pitch) that is smaller than the first pitch. In some implementations, air-dielectric coaxial lines are used in the interconnect and in the AS coaxial structure. Using air as a dielectric may reduce dielectric losses while the lower dielectric constant of air may permit larger conductors and lower conductive losses for a given impedance relative to most commonly used dielectrics; however, dielectrics other than air may be used. Using a coaxial configuration also may reduce skin depth conductivity losses.

In some implementations, other dielectrics may be used in addition to, or instead of, air. Examples of such dielectrics include, but are not limited to, plastic, ceramic, and glass. In examples where air is used, additional dielectric material may be used to maintain and/or support spacing between an outer, non-air material and an interior conductive material adjacent to air. In some implementations, there may be additional dielectric material between the interior conductive material and the air. For example, from inner to outer, the sequence may proceed as: inner conductive material, dielectric, air, outer material and so forth, if applicable. Each dielectric in any implementation may be composed of multiple dielectric materials.

In order to promote consistency in signal transmission, electrical characteristics of different conduits in the interconnect should substantially match. For example, the impedances of different conduits should be controlled to be substantially the same. In this context, impedance-controlled includes the ability to specify the impedance of individual conduits and to match the impedances of different conduits. Also, the electrical path length (as opposed to the physical path length) as measured by ToF (Time of Flight) of the different conduits should be substantially the same. And, the signal attenuation produced by different electrical conduits should be substantially the same. In some implementations, all electrical conduits in the interconnect have the same impedance, electrical path length, and attenuation. In other implementations, this need not be the case. For example, in some implementations, the test electronics may account for, and/or correct for, variations in one or more of these parameters.

In an example implementation, the electrical elements included on PCB 201 include electronic devices that are part of a radio frequency (RF) probe function. In other implementations, the test systems described herein may be used to provide interconnects for different types of touch-down, or other, test functions.

As shown in FIG. 2, example test system 200 includes a PCB 201 of the type shown in FIG. 1, which includes electrical elements. In this example, the electrical elements include electronic devices 202 that are part of a probe card used to perform wafer-level tests on a DUT. However, the systems described herein are not limited to use with PCBs containing electronic devices that are part of a probe card. Rather, the electrical elements may include, e.g., anything to or from which a signal can be routed. For example, the electrical elements may include cables or other types of electrical conduits that terminate on the PCB. In this example, the PCB also includes structural stiffener 204. Also in this example, circuitry 225 is associated with each corresponding electronic device.

Electronic devices 202 are arranged at a first pitch, as shown in FIG. 2. The first pitch may be any distance between electronic devices. In the example of FIG. 2, the pitch at which electronic devices 202 are arranged is greater than the pitch of corresponding DUT contacts on wafer 205. However, as noted above, in other implementations, this may not be the case. For example, in other implementations, the pitch at which electronic devices 202 are arranged may be less than, or equal to, the pitch of corresponding DUT contacts on wafer 205. Electronic devices 202 on PCB 201 map to corresponding DUT contacts 206 on wafer 205. That is, there is an electrical pathway between appropriate signal contacts on electronic devices 202 and corresponding DUT contacts on wafer 205. Accordingly, testing of a DUT on wafer 205 may be enabled by electronic devices 202 on PCB 201 by routing signals to/from, DUTs on wafer 205 via the electrical pathway.

Figure 3:
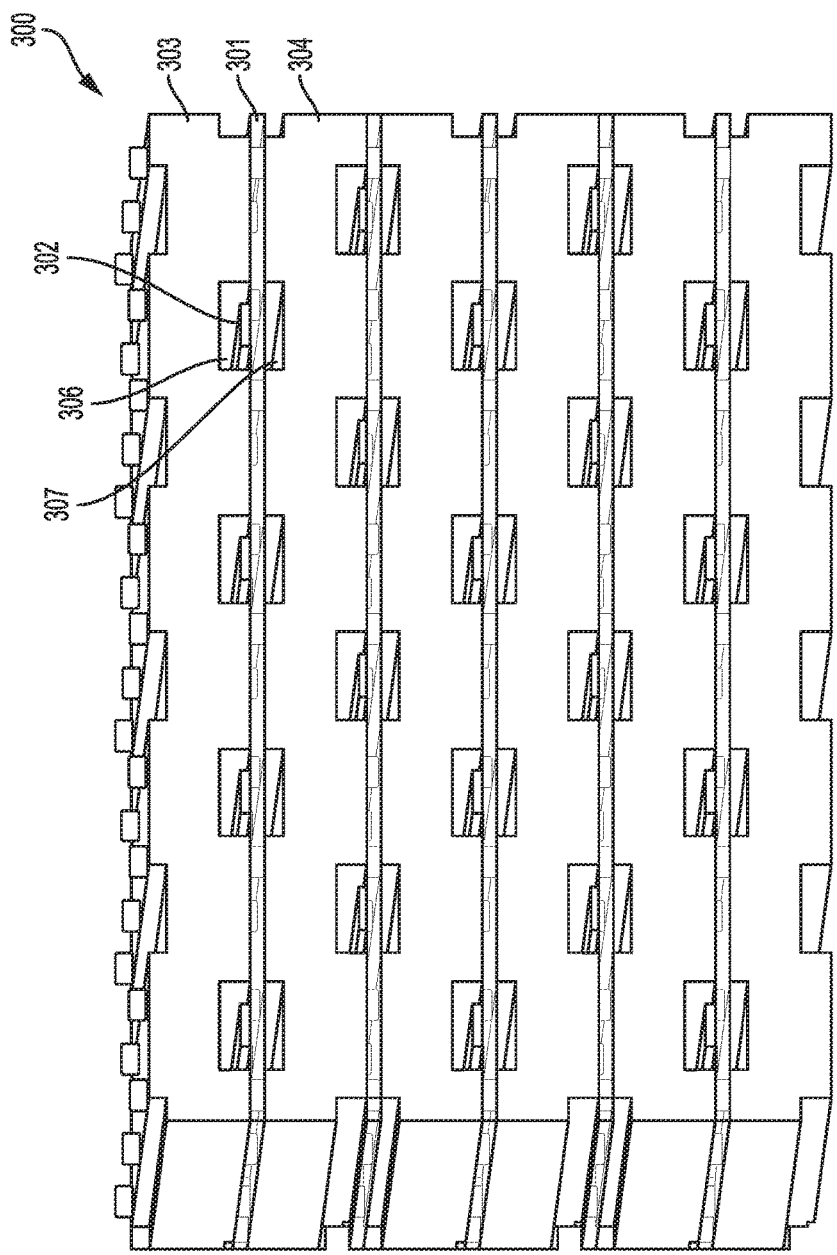
FIG. 3 is a perspective, vertical cut-away view of an example implementation of an interconnect that is usable in a test system and that is implemented using flexible circuits.

The electrical pathway between electronic devices 202 and contacts 206 on wafer 205 includes interconnect 209. In some implementations, interconnect 209 is formed using a flexible ("flex") circuit containing a printed conductor thereon. In this example implementation, a flex circuit is a circuit substrate that bends back upon itself, and is made of thin layers of one or more flexible materials. In some implementations, a flex circuit may have a thickness of 0.001 inches; however, in other implementations, the thickness may be more or less than this value. The printed conductor is surrounded by one or more dielectric materials. The one or more dielectric materials are then surrounded by one or more shielding layers, which may function as return paths in the resulting coaxial structure. FIG. 3 shows a cut-away view of an example interconnect 300 that has the foregoing construction.

Interconnect 300 includes multiple instances of the following structures. A flex circuit substrate 301 is comprised of a dielectric material such as, but not limited to, plastic. A conductor (e.g., a conductive trace) 302 is printed on flex circuit substrate and functions as a signal line for passing signals through the interconnect, e.g., between the application space (AS) and a DUT. The flex circuit substrate is sandwiched between layers 303, 304 of conductive shielding layers. These conductive layers 303, 304 act as a return path for the signal line on the flex circuit substrate. The conductive layers 303, 304 include respective cut-way portions 306, 307. In this implementation, each conductive layer above a conductive conductor and below the conductor is arranged so that at least part of the conductor is between cut-away portions of different conductive layers. For example, as shown in FIG. 2, cut-away portion 306 of conductive layer 303 is above conductor 302 and cut-away portion 307 of conductive layer 304 is below conductor 302. The result is a coaxial structure in which the conductor is completely or partially surrounded by one or more dielectrics (in this example, plastic and air), and the one or more dielectrics are completely or partially surrounded by conductive shielding. The example interconnect of FIG. 3 may be constructed by successively arranging a layer of conductive material, followed by one or more flex circuit substrates, followed by another layer of conductive material, and so forth.

In some implementations, other dielectrics may be used in each cut-away portion in addition to, or instead of, or in addition to, air and plastic. Examples of such dielectrics include, but are not limited to, plastic, ceramic, and glass. In examples where air is used, additional dielectric material may be used to maintain and/or support spacing between an outer, non-air material and an interior conductive material adjacent to air. In some implementations, there may be additional dielectric material between the interior conductive material and the air. For example, from inner to outer, the sequence may proceed as: inner conductive material, dielectric, air, outer material and so forth, if applicable. Each dielectric in any implementation may be composed of multiple dielectric materials.

Figure 4:
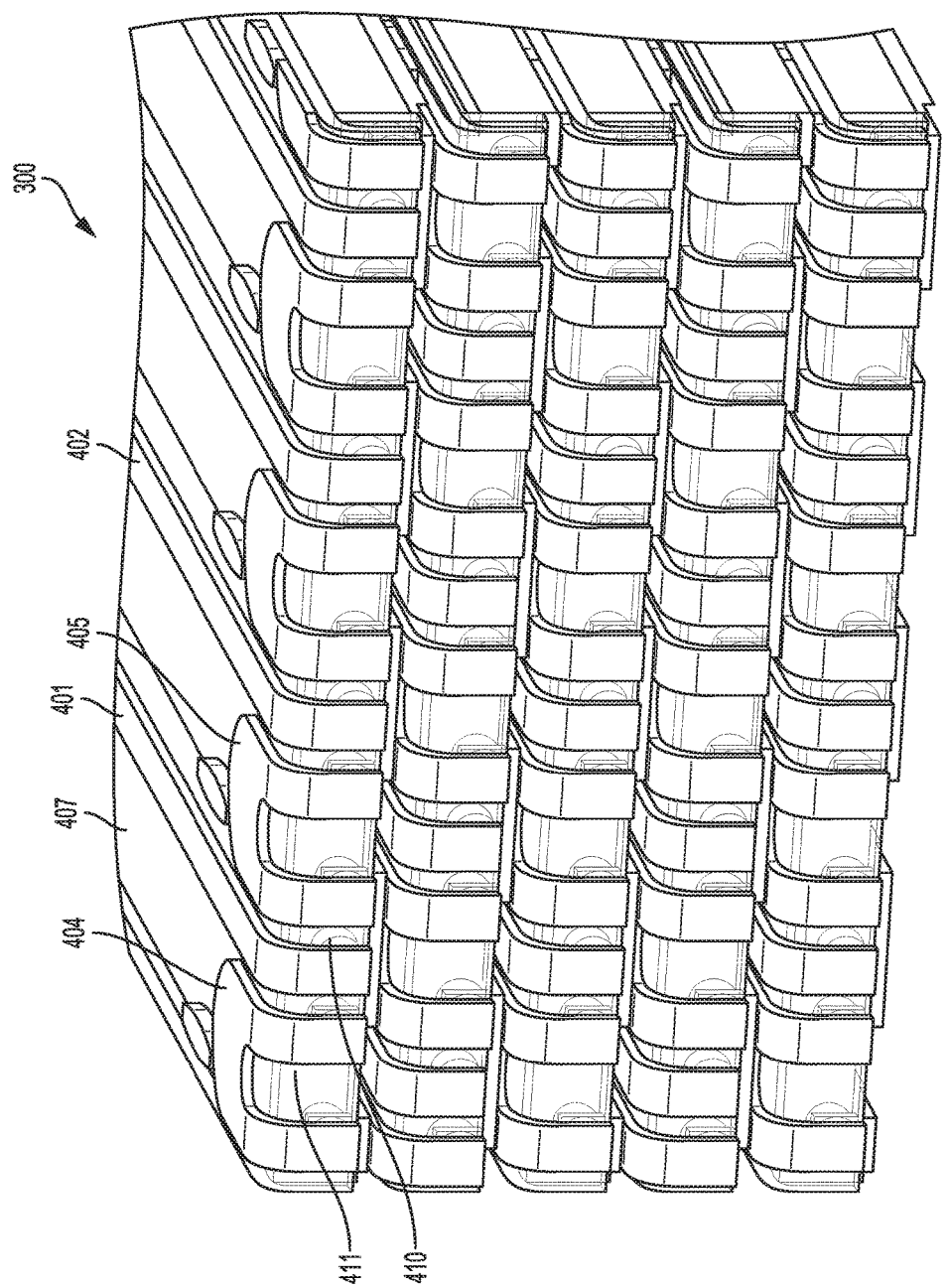
FIG. 4 is a perspective, horizontal cut-away view of an example implementation of an interconnect that is usable in a test system and that is implemented using flexible circuits.

FIG. 4 shows a perspective view of interconnect 300, with the top layer (plate) removed. In this example implementation, conductive traces outside of the interconnect allow the interconnect to electrically connect to other elements, such as interposer 210 and contact assembly 212 of FIG. 2 (described below). As shown in FIG. 4, connections are provided for signal paths 401, 402, and for return paths 404, 405, with the return paths being electrically connected to a corresponding conductive layer 407. In this example implementation, the connections to the signal lines include the conductive trace of the flex circuit bent over a dielectric 410 so as to prevent connection between the conductive trace and the conductive layer 407. For example, each flex circuit may extend beyond a face 411 of interconnect 300. In some implementations, the dielectric (e.g., plastic) portion of the flex circuit may be removed, leaving only the conductive trace exposed for electrical connection.

Figure 5:
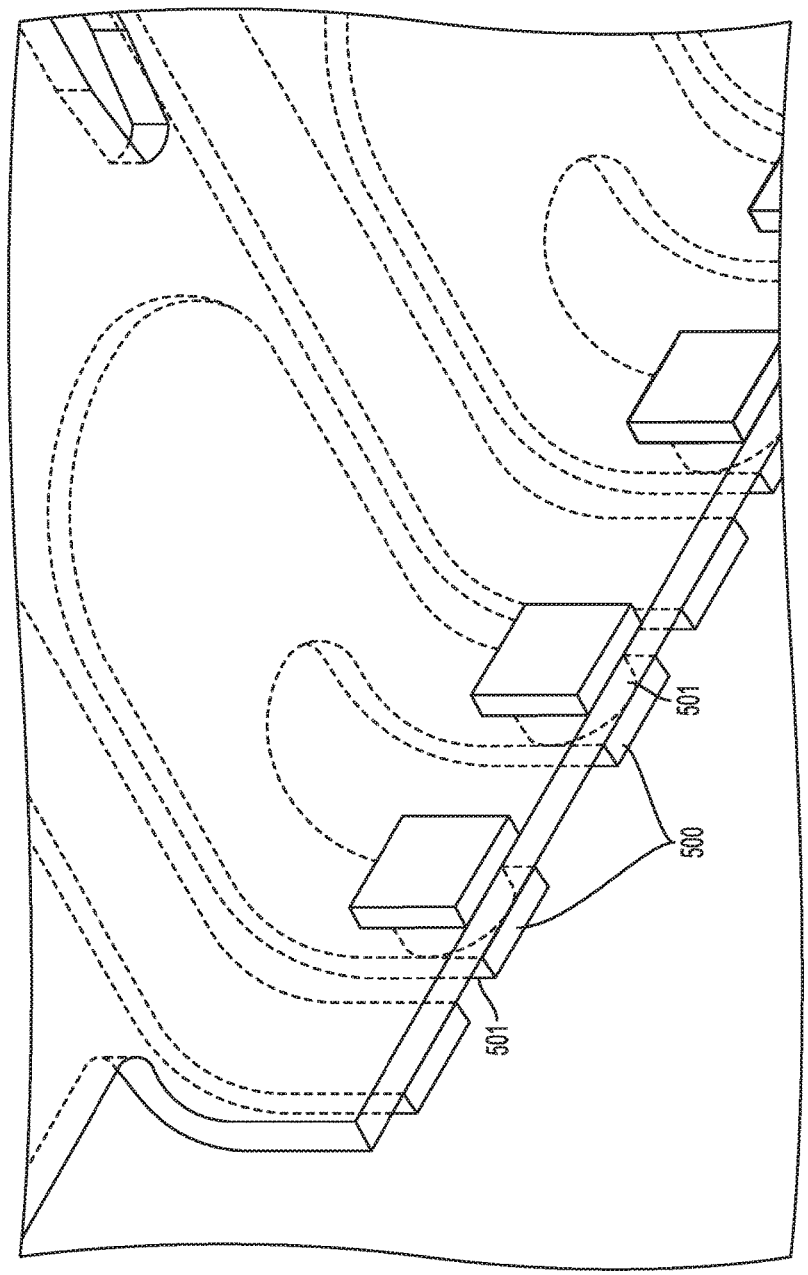
FIG. 5 is a perspective, back view of components used in an example implementation of an interconnect that is usable in a test system

FIG. 5 shows an underside view of contacts 500 for the return paths. As shown there, electrically conductive structures 501 establish an electrical connection between a conductive trace and an underlying conductive layer (not shown). In other implementations, electrical connections may be established differently. The same, or different, types of electrical connections may be at both ends of the interconnect. Any of the types of connections described herein may be used.

Figure 6:
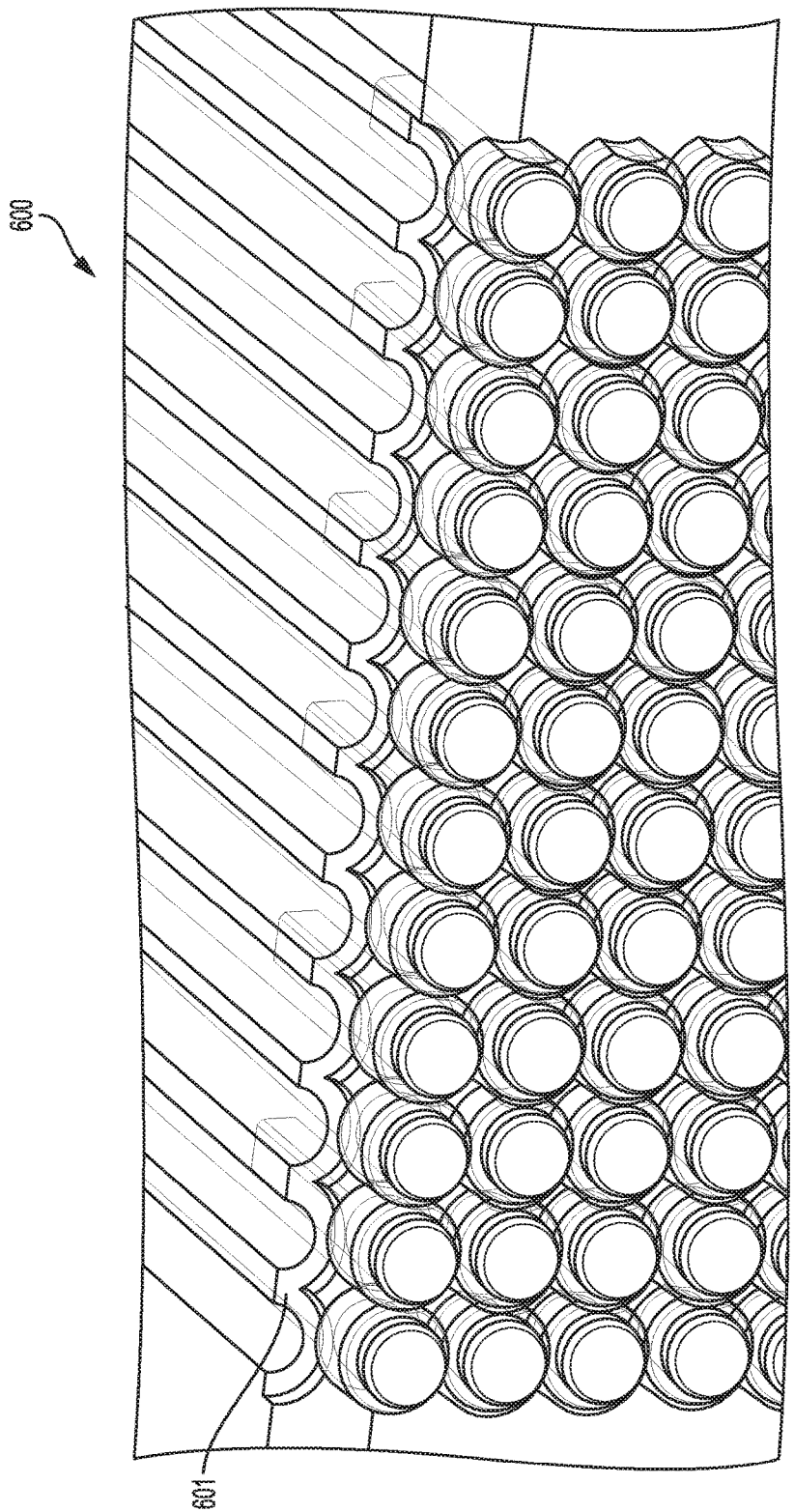
FIG. 6 is a perspective, horizontal cut-away view of an example implementation of a portion of an interconnect that is usable in a test system and that is implemented using miniature coaxial cables.
Figure 7:
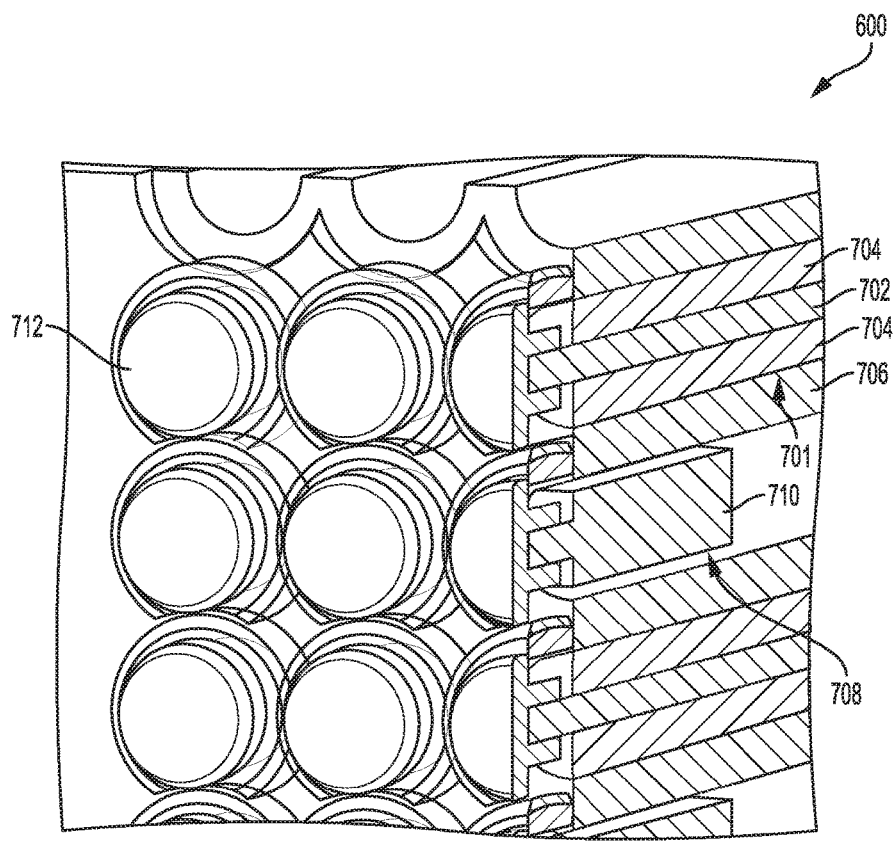
FIG. 7 is a perspective, vertical cut-away view of an example implementation of a portion of an interconnect that is usable in a test system and that is implemented using miniature coaxial cables.

FIG. 6 shows an alternative implementation of an interconnect 600 for transmitting electrical signals between different elements of a test system. In the example implementation of FIG. 6, interconnect 600 includes coaxial structures that are miniature coaxial cables 601. The coaxial structures function as the signal lines in the interconnect. As shown in the cut-away view of FIG. 7, each coaxial cable 701 has a coaxial structure, which includes a conductive conduit 702 that functions as a signal line, a dielectric 704 surrounding or substantially surrounding the conductive conduit, and a conductive (e.g., metallic) shielding structure 706 that is around or substantially around the dielectric and that functions as a return path. In the example of FIG. 7, the return connections 708 include an electrically conductive connection 710 to the shielding structure 706.

In the example implementation of FIGS. 6 and 7, external connections to interconnect 600 are implemented using nail heads 712. In this example, a nail head includes any conductive termination that is electrically connectable to a conductive conduit 702/connection 710. Nail heads may be used to establish electrical connection between the interconnect and other component(s) of the test system. The same, or different, types of electrical connections may be at both ends of the interconnect. Any of the types of connections described herein may be used.

Figure 8:
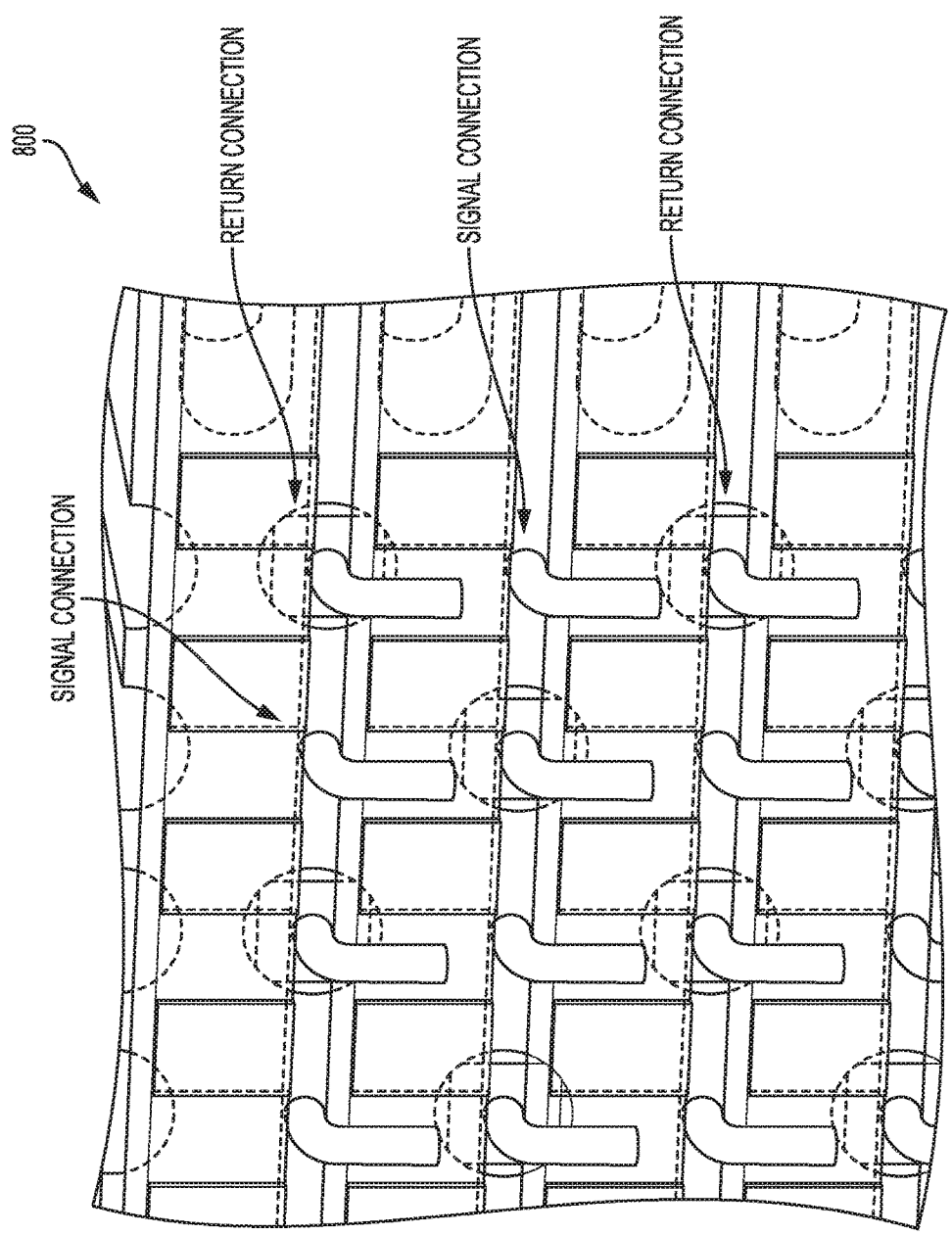
FIG. 8 is a perspective, front view of an example implementation of a portion of an interconnect that is usable in a test system and that includes exposed conduits for use in making electrical connections.
Figure 9:
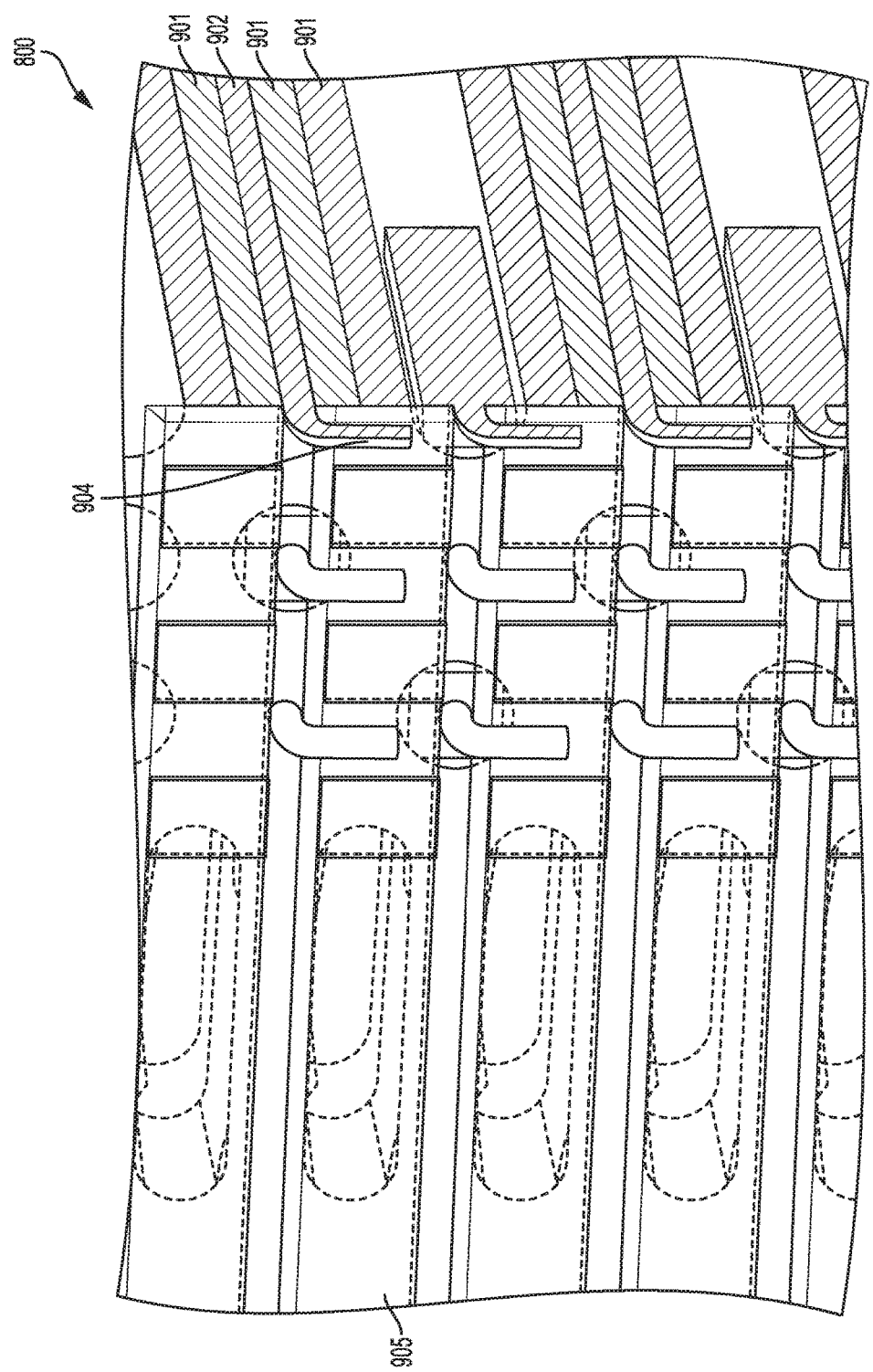
FIG. 9 is a perspective, vertical cut-away view of an example implementation of a portion of an interconnect that is usable in a test system and that includes exposed conduits for use in making electrical connections.

In some implementations, structures other than nail heads may be used to establish electrical connection to other components of the test system. For example, in the example interconnect 800 shown in FIG. 8, a connection mechanism similar to that of the implementation of FIG. 4 may be used. Referring also to FIG. 9, dielectric 901 is stripped from a conductive trace 902 on the outside of the interconnect, leaving an exposed conductor 904. A dielectric plate 905 may be mounted to the face of the interconnect, so as to prevent shorting of the conductor to the conductive layers (return). An electrical connection may be made to the exposed conductor using any appropriate connection technology. As above, the same, or different, types of electrical connections may be at both ends of the interconnect. As above, any of the types of connections described herein may be used.

Figure 10:
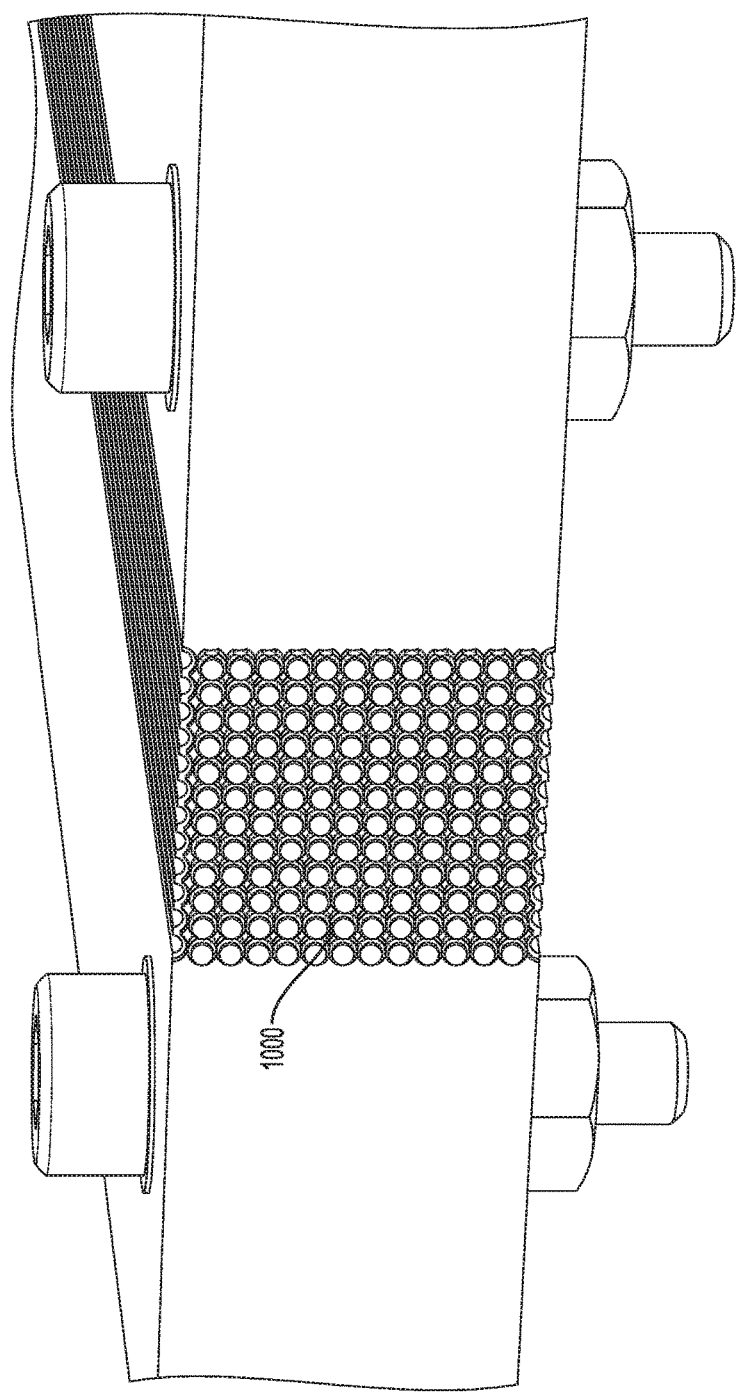
FIG. 10 is a perspective view of an example implementation of a portion of an interconnect that is usable in a test system and that includes nail head terminations for use in making electrical connections.
Figure 11:
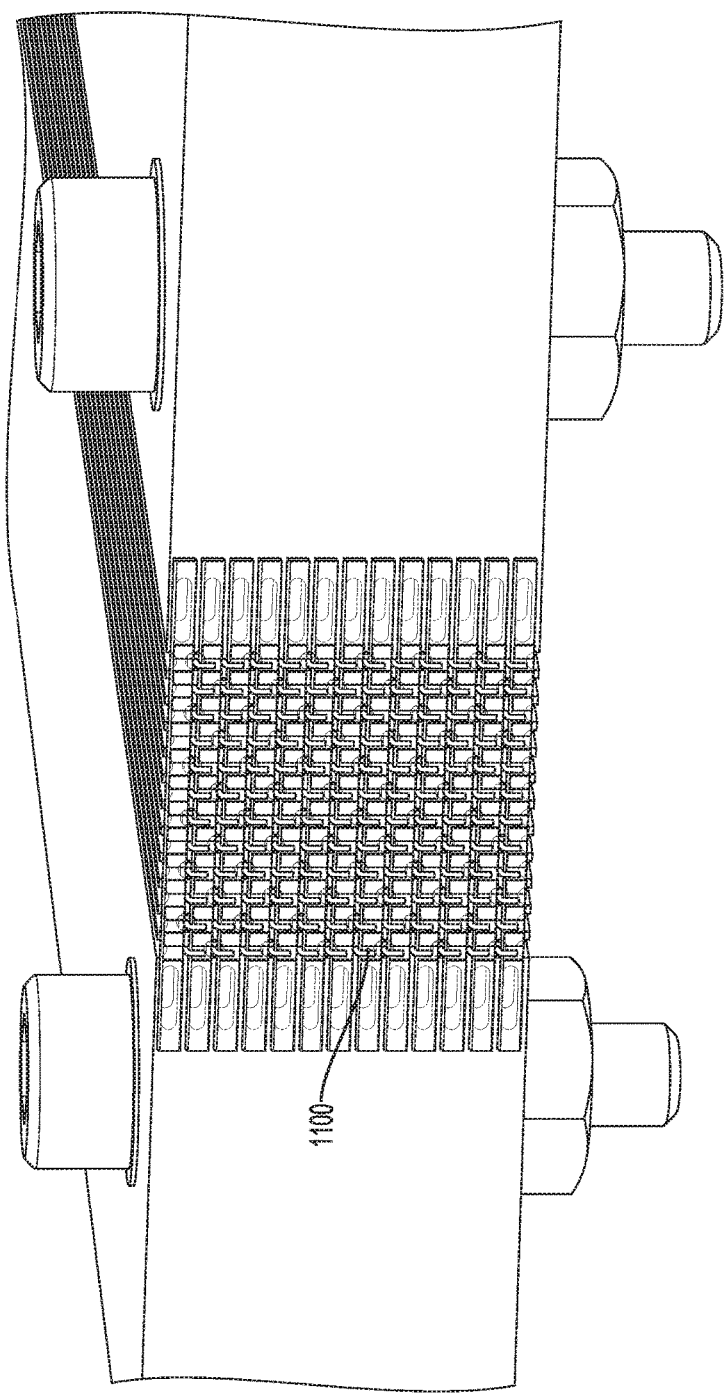
FIG. 11 is a perspective view of an example implementation of an interconnect that is usable in a test system and that includes exposed conduits for use in making electrical connections.

FIG. 10 shows a view of an implementation of an interconnect that uses nail heads 1000 to make electrical connections. FIG. 11 shows a view of an implementation of an interconnect that uses bent wires 1100 to make electrical connections.

Referring back to FIG. 2, in some implementations, the electrical pathway between electronic devices on the PCB and contacts on the wafer includes structures in addition to interconnect 209. For example, such structures may include an interposer material 210 that electrically and physically connects PCB 201 and interconnect 209. The structures may also include a contactor assembly 212. Contactor assembly 212 may electrically and physically connect interconnect 209 and contacts 206 on wafer 205. In some implementations, contactor assembly 212 may include one or more pins (e.g., spring-based POGO® pins) that electrically and physically connect electrical conduits in the interconnect to corresponding contacts on the wafer. In other implementations, contactor assembly 212 may include one or more MEMS (Micro Electro-Mechanical Systems) devices that make the appropriate electrical and physical connection between electrical conduits in the interconnect and corresponding contacts on the wafer. In some implementations, fewer or more structures than are shown in FIG. 2 may be included. The other structures noted above, such as the interposer or contact assembly, may also include coaxial structures for the transmission of signals which are formed as described herein.

In some implementations, the electrical pathway between electronic devices on the PCB and contacts on the wafer includes an interconnect only. In such implementations, structures and/or functions of interposer material 210, contactor assembly 212, and any other appropriate intermediary structures may be constructed as part of the interconnect during the additive-manufacturing process that forms the interconnect. In some example implementations, these structures may be formed inside of, or incorporated into, the interconnect.

As part of a testing process, the structure 220 comprised of PCB 201, interposer material 210, interconnect 209, and contactor assembly 212 may be brought into contact (e.g., electrical connection) with contacts for a block of DUTs 221. These DUTs may be tested in parallel, e.g., simultaneously. Thereafter, the structure 220 may be brought into contact with another block 222 of DUTs on wafer 205, and those DUTs may be tested in parallel. This process may be repeated until all DUTs on the wafer are tested. The testing process may be computer controlled. For example, movement across a wafer may be computer-controlled, the application and analysis of test signals may be computer-controlled, and so forth.

In the example interconnect described herein, at least some of (e.g., all of) the electrical conduits are configured to have substantially matching electrical characteristics, such as electrical path lengths/Time of Flight (ToF), impedances, and signal attenuation. By substantially matching these electrical characteristics, it is possible to reduce the chances that there will be differences in signal transmission time between conduits, and thereby reduce timing errors resulting from transmission through the interconnect. In this context, a substantial match may include a match that is identical or to within one or more predefined tolerances. In some implementations, it may only be appropriate to substantially match only one or two of electrical path length, impedance, and signal attenuation.

In some implementations, matching electrical characteristics are achieved, at least in part, by using, e.g., curved, zig-zagged, serpentine, or spring-shaped conduit portions. For example, individual conduits within the interconnect may include portions such as these that are not straight. These portions may be configured so that the electrical path lengths, impedances, and signal attenuation are the same among different conduits. For example, the addition of a curved, zig-zagged, serpentine, or spring-shaped conduit portion effectively elongates the signal transmission path of a conduit, thereby changing the electrical characteristics of those conduits. For example, such curved, zig-zagged, serpentine, or spring-shaped conduit portions can be used to change electrical path lengths, impedances, and signal attenuation. Such changes may be effected to match electrical characteristics (e.g., electrical path lengths, impedances, and signal attenuation) between two different conduits in the interconnect. Curved, zig-zagged, serpentine, or spring-shaped conduit portions may be added to any appropriate part or parts of a conduit to achieve desired electrical characteristics.

In some implementations, additional passive and/or active electrical components may be incorporated into the interconnect to change electrical characteristics such as electrical path lengths, impedances, and signal attenuation, so as to match those characteristics among two or more electrical conduits. In some implementations, the shapes of different conduits may vary to achieve appropriate matching. In some implementation, differently-shaped conduits in combination with active and/or passive components may be used to change electrical characteristics such as electrical path lengths, impedances, and signal attenuation, so as to match those characteristics among two or more electrical conduits.

While this specification describes example implementations related to "testing" and a "test system," the devices (e.g., the interconnect) and methods described herein may be used in any appropriate system, and are not limited to test systems or to the example test systems described herein.

Testing performed as described herein may be implemented and/or controlled using hardware or a combination of hardware and software. For example, a test system like the ones described herein may include various controllers and/or processing devices located at various points. A central computer may coordinate operation among the various controllers or processing devices. The central computer, controllers, and processing devices may execute various software routines to effect control and coordination of testing and calibration.

Testing can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing and calibration can be performed by one or more programmable processors executing one or more computer programs to perform the functions described herein. All or part of the testing and calibration can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass PCBs for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a connection that includes intervening components but that nevertheless allows electrical signals to flow between connected components. Any "connection" involving electrical circuitry mentioned herein, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A system comprising:
    a circuit board comprising electrical elements;
    a wafer comprising contacts; and
    an interconnect to route signals between the electrical elements and the contacts, the interconnect comprising multiple layers, each of the multiple layers comprising a flexible circuit, the flexible circuit comprising a conductive trace disposed thereon, the interconnect further comprising shielding between adjacent layers of the multiple layers, the shielding being electrically connected to ground, the shielding and the multiple layers comprising part of a coaxial transmission structure that extends through an entirety of the interconnect and through the circuit board to connect to the electrical elements;
    wherein the shielding comprises multiple layers of shielding arranged within the interconnect so that each conductive trace is between two layers of shielding, each of the two layers of shielding having a cut-away portion adjacent to a corresponding conductive trace.

2. The system of claim 1, wherein the flexible circuit comprises a dielectric, an end of the conductive trace extending beyond the dielectric; and
    wherein the interconnect comprises a second dielectric, the end of the conductive trace bending around the second dielectric, the end of the conductive trace comprising an electrical contact.

3. The system of claim 1, wherein the shielding for each conductive trace comprises a conductive layer above the conductive trace and a conductive layer below the conductive trace, each of the conductive layer above the conductive trace and the conductive layer below the conductive trace being arranged so that at least part of the conductive trace is between cut-away portions of different conductive layers.

4. The system of claim 1, wherein a cut-away portion of each of the two layers is arranged relative to the conductive trace so that there is air between the conductive trace and each of the two layers of shielding.

5. The system of claim 1, wherein at least some conductive traces in the interconnect comprise curved or serpentine portions configured to achieve substantially matching electrical path lengths and time-of-flight, impedances, and signal attenuation between different conductive traces in the interconnect.

6. The system of claim 1, wherein the electrical elements are arranged at a first pitch and the contacts are arranged at a second pitch; and
wherein the interconnect is configured to translate between the first pitch and the second pitch.

7. The system of claim 1, wherein the circuit board further comprises:
electronics associated with each of the electrical elements, wherein electronics associated with a corresponding electrical element are for supporting operation of the corresponding electrical element.

8. The system of claim 1, wherein each of the electrical elements comprises part of a radio frequency (RF) probe card.

9. The system of claim 1, wherein the electrical elements comprise electrical cables that terminate on the circuit board.

10. The system of claim 1, wherein the contacts are arranged in parallel rows on the wafer; and
wherein the system further comprises:
a tester to make electrical contact between the interconnect and a subset of the contacts.

11. The system of claim 1, further comprising:
an interposer between the interconnect and the circuit board, the interposer comprising a part of an electrical pathway between the electrical elements and the contacts.

12. The system of claim 11, further comprising:
contacts on the interposer that are electrically-conductive and mechanically-compliant, the contacts to provide a mechanically-compliant electrical connection between the interposer and the corresponding contacts on the interconnect.

13. The system of claim 1, further comprising:
pins between the interconnect and the wafer, the pins for providing at least part of an electrical pathway between the contacts and the interconnect; and
an interface board, the interface board being at least part of the electrical pathway containing the contacts and the interconnect, the interface board comprising electronic components in the electrical pathway.

14. The system of claim 13, wherein the electronic components are passive electronic components.

15. The system of claim 14, wherein the electronic components comprise at least one of capacitors, baluns or switches.

16. The system of claim 13, wherein the electronic components comprise active electronic components.

17. A system comprising:
a circuit board comprising electrical elements;
a wafer comprising contacts; and
an interconnect to route signals between the electrical elements and the contacts, the interconnect comprising multiple layers, each of the multiple layers comprising a conductor surrounded by a dielectric, the interconnect further comprising shielding between adjacent layers of the multiple layers, the shielding being electrically connected to ground, the shielding and the multiple layers comprising part of a coaxial transmission structure that extends through an entirety of the interconnect and through the circuit board to connect to the electrical elements;
wherein the shielding comprises multiple layers of shielding arranged within the interconnect so that each conductor is between two layers of shielding, each of the two-layers of shielding having a cut-away portion adjacent to a conductor.

18. The system of claim 17, wherein an end of the conductor extends beyond the dielectric; and
wherein the interconnect comprises a second dielectric, the end of the conductor bending around the second dielectric, the end of the conductor comprising an electrical contact.

19. The system of claim 17, wherein the shielding for each conductor comprises a conductive layer above the conductor and a conductive layer below the conductor, each of the conductive layer above the conductor and the conductive layer below the conductor being arranged so that at least part of the conductor is between cut-away portions of different conductive layers.

20. The system of claim 17, wherein a cut-away portion of each of the two layers is arranged relative to the conductor so that there is air between the conductor and each of the two layers of shielding.

21. The system of claim 17, wherein at least some conductors in the interconnect comprise curved or serpentine portions configured to achieve substantially matching electrical path lengths and time-of-flight, impedances, and signal attenuation between different conductors in the interconnect.

22. The system of claim 17, wherein the electrical elements are arranged at a first pitch and the contacts are arranged at a second pitch; and
wherein the interconnect is configured to translate between the first pitch and the second pitch.

23. The system of claim 17, further comprising:
an interposer between the interconnect and the circuit board, the interposer comprising a part of an electrical pathway between the electrical elements and the contacts.

24. The system of claim 17, further comprising:
contacts on the interposer that are electrically-conductive and mechanically-compliant, the contacts to provide a mechanically-compliant electrical connection between the interposer and the corresponding contacts on the interconnect.

25. The system of claim 17, wherein the circuit board further comprises:
electronics associated with each of the electrical elements, wherein electronics associated with a corresponding electrical element are for supporting operation of the corresponding electrical element.

26. The system of claim 17, wherein each of the electrical elements comprises part of a radio frequency (RF) probe card.

27. The system of claim 17, wherein the electrical elements comprise electrical cables that terminate on the circuit board.

28. The system of claim 17, wherein the contacts are arranged in parallel rows on the wafer; and
wherein the system further comprises:
a tester to make electrical contact between the interconnect and a subset of the contacts.

29. The system of claim 17, wherein an end of the conductor extends beyond the dielectric and contacts a conductive nail head comprising an electrical contact.

30. The system of claim 29, wherein the electronic components comprise at least one of capacitors, baluns or switches.

31. The system of claim 30, wherein the electronic components comprise capacitors, baluns and switches.

32. The system of claim 17, further comprising:
pins between the interconnect and the wafer, the pins for providing at least part of an electrical pathway between the contacts and the interconnect; and
an interface board, the interface board being at least part of the electrical pathway containing the contacts and the interconnect, the interface board comprising electronic components in the electrical pathway.

33. The system of claim 32, wherein the electronic components are passive electronic components.

34. The system of claim 32, wherein the electronic components comprise active electronic components.

35. A structure for transmitting electrical signals, comprising:
multiple layers, each of the multiple layers comprising:
flexible circuits, each of the flexible circuits comprising a conductive trace disposed thereon for transmitting the electrical signals; and
for each flexible circuit, shielding adjacent to the flexible circuit, the shielding being electrically connected to ground and comprising a return path for a conductive trace in the flexible circuit, the shielding being separated from the conductive traces by a gap containing air;
wherein the structure is part of a coaxial transmission line that extend at least between an application space of a test system and a device under test; and
wherein each conductive trace is between two layers of shielding, each of the two-layers of shielding having a cut-away portion adjacent to a corresponding conductive trace.

36. The structure of claim 35, wherein each flexible circuit comprises a dielectric, an end of the conductive trace extending beyond the dielectric; and
wherein the structure further comprises a second dielectric, the end of the conductive trace bending around the second dielectric, the end of the conductive trace comprising an electrical contact.

37. The structure of claim 35, wherein the shielding for the conductive trace comprises a conductive layer above the conductive trace and a conductive layer below the conductive trace, each of the conductive layer above the conductive trace and the conductive layer below the conductive trace being arranged so that at least part of the conductive trace is between cut-away portions of different conductive layers.

38. The structure of claim 35, wherein a cut-away portion of each of the two layers is arranged relative to the conductive trace so that there is an air gap between the conductive trace and each of the two layers of shielding.

39. The structure of claim 35, wherein at least some conductive traces in the structure comprise curved or serpentine portions configured to achieve substantially matching electrical path lengths and time-of-flight, impedances, and signal attenuation between different conductive traces.

40. A structure for transmitting electrical signals, comprising:
multiple layers, each of the multiple layers comprising:
conductors, each conductor being on a flexible dielectric, the conductors for transmitting the electrical signals; and
for each conductor, shielding on each side of the conductor, the shielding being electrically connected to ground and comprising a return path for the conductor, the shielding being separated from the conductor at least by a gap containing air;
wherein the structure is part of a coaxial transmission line that extends at least between an application space of a test system and a device under test; and
wherein each conductor is between two layers of shielding, each of the two-layers of shielding having a cut-away portion adjacent to a conductor.

41. The system of claim 40, wherein an end of the conductor extends beyond corresponding dielectric; and
wherein the structure comprises a second dielectric, the end of the conductor bending around the second dielectric, the end of the conductor comprising an electrical contact.

42. The system of claim 40, wherein an end of the conductor extends beyond the flexible dielectric and contacts a conductive nail head comprising an electrical contact.

43. The system of claim 40, wherein the shielding for each conductor comprises a conductive layer above the conductor and a conductive layer below the conductor, each of the conductive layer above the conductor and the conductive layer below the conductor being arranged so that at least part of the conductor is between cut-away portions of different conductive layers.

44. The system of claim 40, wherein a cut-away portion of each of the two layers is arranged relative to the conductor so that there is air between the conductor and each of the two layers of shielding.

45. The system of claim 40, wherein at least some conductors in the structure comprise curved or serpentine portions configured to achieve substantially matching electrical path lengths and time-of-flight, impedances, and signal attenuation between different conductors in the structure.

* * * * *